US006406959B2

(12) United States Patent
Prall et al.

(10) Patent No.: US 6,406,959 B2
(45) Date of Patent: *Jun. 18, 2002

(54) METHOD OF FORMING FLASH MEMORY, METHOD OF FORMING FLASH MEMORY AND SRAM CIRCUITRY, AND ETCHING METHODS

(75) Inventors: Kirk D. Prall; Gregg Rettschlag; Graham Wolstenholme, all of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,893

(22) Filed: Jan. 4, 1999

(51) Int. Cl.[7] .......................................... H01L 21/8247
(52) U.S. Cl. ....................................................... 438/258
(58) Field of Search ................................. 438/257–267

(56) References Cited

U.S. PATENT DOCUMENTS

| | | | |
|---|---|---|---|
| 5,153,143 A | * 10/1992 | Schlais et al. | |
| 5,376,572 A | * 12/1994 | Yang et al. | |
| 5,424,233 A | * 6/1995 | Yang et al. | |
| 5,498,558 A | * 3/1996 | Kapoor | |
| 5,605,853 A | * 2/1997 | Yoo et al. | |
| 5,691,246 A | 11/1997 | Becker et al. | 437/225 |
| 5,976,927 A | 11/1999 | Hsieh et al. | 438/239 |
| 6,020,229 A | * 2/2000 | Yamane et al. | 438/201 |
| 6,043,123 A | * 3/2000 | Wang et al. | 438/258 |
| 6,074,915 A | * 6/2000 | Chen et al. | 438/258 |
| 6,074,959 A | 6/2000 | Wang et al. | 437/738 |
| 6,096,603 A | * 8/2000 | Chang et al. | 438/258 |
| 6,149,828 A | 11/2000 | Vaartstra | 216/57 |
| 6,197,639 B1 | * 3/2001 | Lee et al. | 438/258 |

OTHER PUBLICATIONS

U.S. Patent application 09/260,182, filed Mar. 1, 1999.

U.S. Patent application 09/516,818, filed Mar. 1, 2000.

U.S. application No. 09/768,878, Wolstenholme.

* cited by examiner

Primary Examiner—Richard Booth
(74) Attorney, Agent, or Firm—Wells St. John P.S.

(57) ABSTRACT

In one implementation, a method of forming an array of FLASH memory includes forming a plurality of lines of floating gates extending from a memory array area to a peripheral circuitry area over a semiconductor substrate. In a common masking step, discrete openings are formed over a) at least some of the lines of floating gates in the peripheral circuitry area, and b) floating gate source area in multiple lines along at least portions of the lines of floating gates within the memory array area. In one implementation, a line of floating gates is formed over a semiconductor substrate. A conductive line different from the line of floating gates is formed over the semiconductor substrate. In a common masking step, discrete openings are formed to a) at least one of the conductive line and the line of floating gates, and b) floating gate source area of multiple transistors comprising the line of floating gates along at least a portion of the line of floating gates. In one implementation, a method of forming FLASH memory and SRAM circuitry includes forming a line of floating gates over a semiconductor substrate and an SRAM gate over the semiconductor substrate. In a common masking step, discrete openings are formed over a) the SRAM gate, and b) floating gate source area of multiple transistors comprising the line of floating gates along at least a portion of the line of floating gates. Other implementations are disclosed.

60 Claims, 8 Drawing Sheets

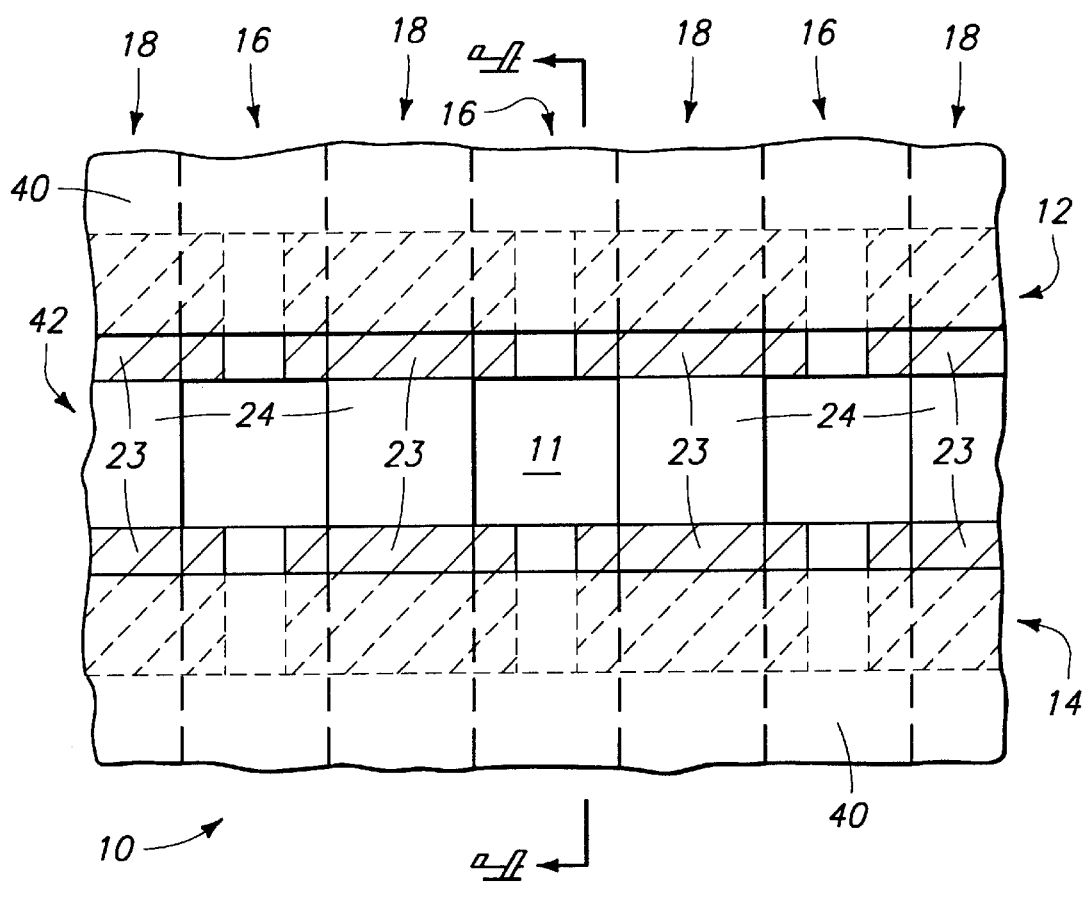

METHOD OF FORMING FLASH MEMORY, METHOD OF FORMING FLASH MEMORY AND SRAM CIRCUITRY, AND ETCHING METHODS

TECHNICAL FIELD

This invention relates to methods of forming FLASH memory, to methods of forming FLASH memory and SRAM circuitry, and to etching methods.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line. Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array. Accordingly, prior art techniques have been utilized to form a line of continuously running implanted source material within the semiconductor substrate and running parallel with the floating gate word lines.

In a principal technique of achieving the same, the substrate has first been fabricated to form field oxide regions by LOCOS. The fabrication forms alternating strips of active area and LOCOS field oxide running substantially perpendicular to the floating gate word lines which will be subsequently formed. Thus running immediately adjacent and parallel with the respective word lines will be an alternating series of LOCOS isolation regions and active area regions on both the source and drain sides of a respective line of floating gates. After forming the lines of floating gates and to provide a continuous line of essentially interconnected source regions, the substrate is masked to form an exposed area on the source side of the respective lines of floating gates. The LOCOS oxide is then selectively etched relative to the underlying substrate. This leaves a series of spaced trenches along the lines of floating gates the result of removal of oxide from the previously oxidized substrate which formed the LOCOS regions.

Non-recessed LOCOS in fabrication of FLASH memory in this manner is typically very shallow relative to the semiconductor substrate (i.e., less than 1500 Angstroms deep). This leaves a gradual, almost sinusoidal, undulating surface of exposed semiconductor substrate running in lines substantially parallel and immediately adjacent the lines of floating gates on the desired source side. With the gently sloping sidewalls of the trenches or recesses left by the LOCOS oxide removal, one or more source ion implant steps are conducted through the mask openings of the remaining photoresist layer. The result is formation of a continuously and conductively doped source line within the semiconductor substrate immediately adjacent the line of floating gates.

Circuitry fabrication and isolation of adjacent circuitry within a semiconductor substrate can also be achieved with a trench isolation that is different from LOCOS. For example, trenches can initially be etched within a semiconductor substrate and subsequently filled with an insulating material, such as high density plasma deposited oxide. Such trenches can and are sometimes made considerably deeper relative to the outer substrate surface as compared to the oxidation depth of LOCOS. Accordingly, the etching typically produces elongated, deeper and straighter sidewalls than LOCOS.

SUMMARY OF INVENTION

This invention comprises methods of forming FLASH memory, methods of forming FLASH memory and SRAM circuitry, and etching methods. In one implementation, a method of forming an array of FLASH memory includes forming a plurality of lines of floating gates extending from a memory array area to a peripheral circuitry area over a semiconductor substrate. In a common masking step, discrete openings are formed over a) at least some of the lines of floating gates in the peripheral circuitry area, and b) floating gate source area in multiple lines along at least portions of the lines of floating gates within the memory array area. In one implementation, a line of floating gates is formed over a semiconductor substrate. A conductive line different from the line of floating gates is formed over the semiconductor substrate. In a common masking step, discrete openings are formed to a) at least one of the conductive line and the line of floating gates, and b) floating gate source area of multiple transistors comprising the line of floating gates along at least a portion of the line of floating gates.

In one implementation, a method of forming FLASH memory and SRAM circuitry includes forming a line of floating gates over a semiconductor substrate and an SRAM gate over the semiconductor substrate. In a common masking step, discrete openings are formed over a) the SRAM gate, and b) floating gate source area of multiple transistors comprising the line of floating gates along at least a portion of the line of floating gates. In one implementation, in a common masking step, a local interconnect opening is formed over and extends from the SRAM gate to a source/drain area in an SRAM cell area and an elongated source implant opening is formed over floating gate source area of multiple transistors comprising the line of floating gates along at least a portion of the line of floating gates.

The invention in one implementation comprises, in a common etching step, etching insulative material over an SRAM gate to expose conductive material of the SRAM gate and insulative material over a semiconductor substrate in a line proximate a line of floating gates to expose the semiconductor substrate. The invention in one implementation comprises, in a common etching step, etching insulative material over an SRAM cell source area to expose semiconductive material of the SRAM cell source area and insulative material over a semiconductor substrate in a line proximate a line of floating gates to expose the semiconductor substrate. The invention also comprises, in a common etching step, etching insulative material over a conductive line to expose conductive material of the line and insulative material over a semiconductor substrate in a line proximate a line of floating gates to expose the semiconductor substrate.

BRIEF DESCRIPTION OF THE DRAWINGS

Preferred embodiments of the invention are described below with reference to the following accompanying drawings.

FIG. 3 is a top plan view of the FIG. 1 semiconductor wafer fragment at a processing step subsequent to that depicted by FIGS. 1 and 2.

FIG. 4 is a view of the FIG. 2 illustrated wafer at a processing step corresponding to that of FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
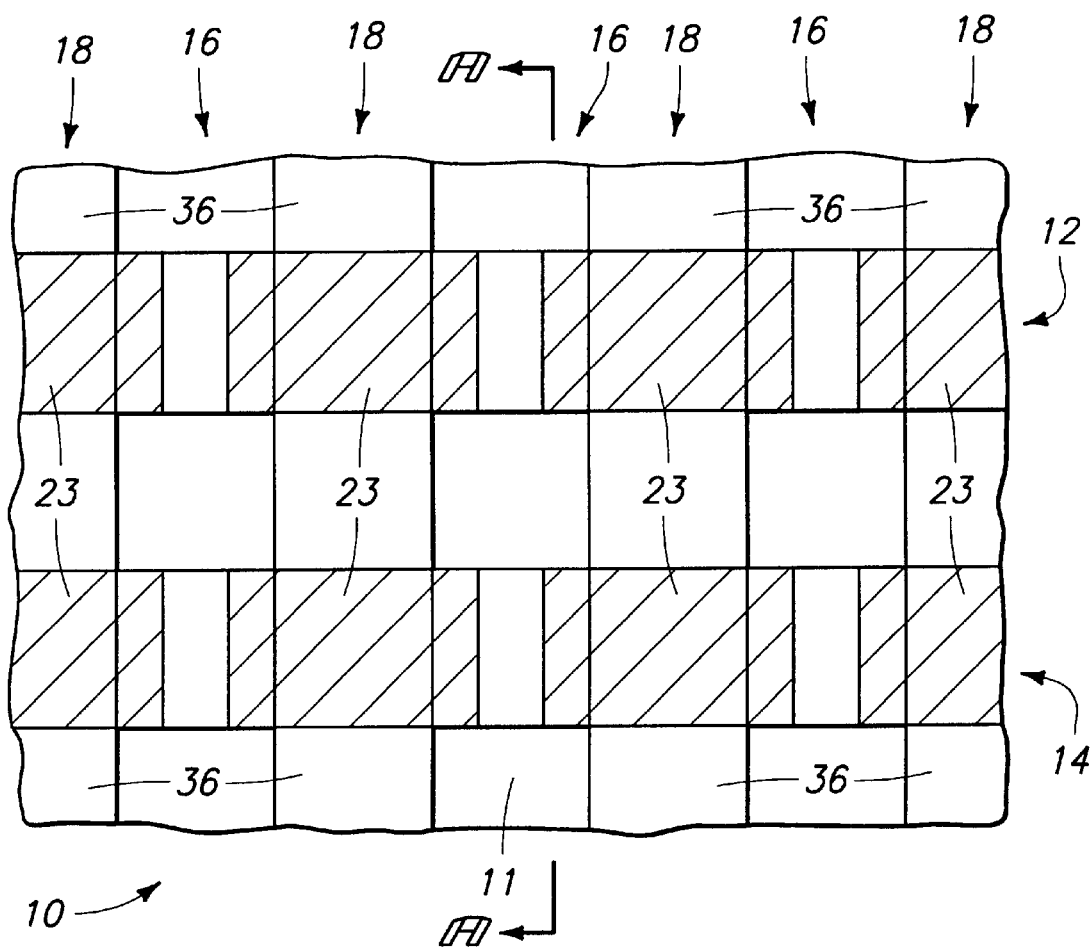
FIG. 1 is a diagrammatic top plan of a semiconductor wafer fragment in process in accordance with the invention.

Referring to FIG. 1, a portion of an array 10 of FLASH memory cells in fabrication is illustrated in top plan view. Such comprises a semiconductor substrate 11 having lines of floating gates 12 and 14 formed thereover. In the context of this document, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductor substrates described above. As illustrated, semiconductor substrate 11 is in the form of a monocrystalline silicon substrate, although SOI and other constructions could also be utilized.

A series of isolation regions 16 are formed relative to semiconductor substrate 11 substantially perpendicular to lines of floating gates 12 and 14. Such can comprise, for example, LOCOS isolation or trench and refill. The area 18 between isolation regions 16 thereby comprises spaced lines of active area relative to substrate 11 running between the spaced isolation regions. The area running parallel with and between lines of floating gates 12 and 14 will eventually constitute source active area for the respective transistors formed along lines of floating gates 12 and 14. Accordingly, the figure can also be considered as depicting in a preferred embodiment an alternating series of isolation regions and active area regions provided in semiconductor substrate 11 in a line running adjacent and along at least a portion of lines of floating gates 12 and 14. Wafer fabrication typically and preferably comprises first fabricating the illustrated isolation regions and active areas, followed by fabrication of the lines of floating gates.

Figure 2:
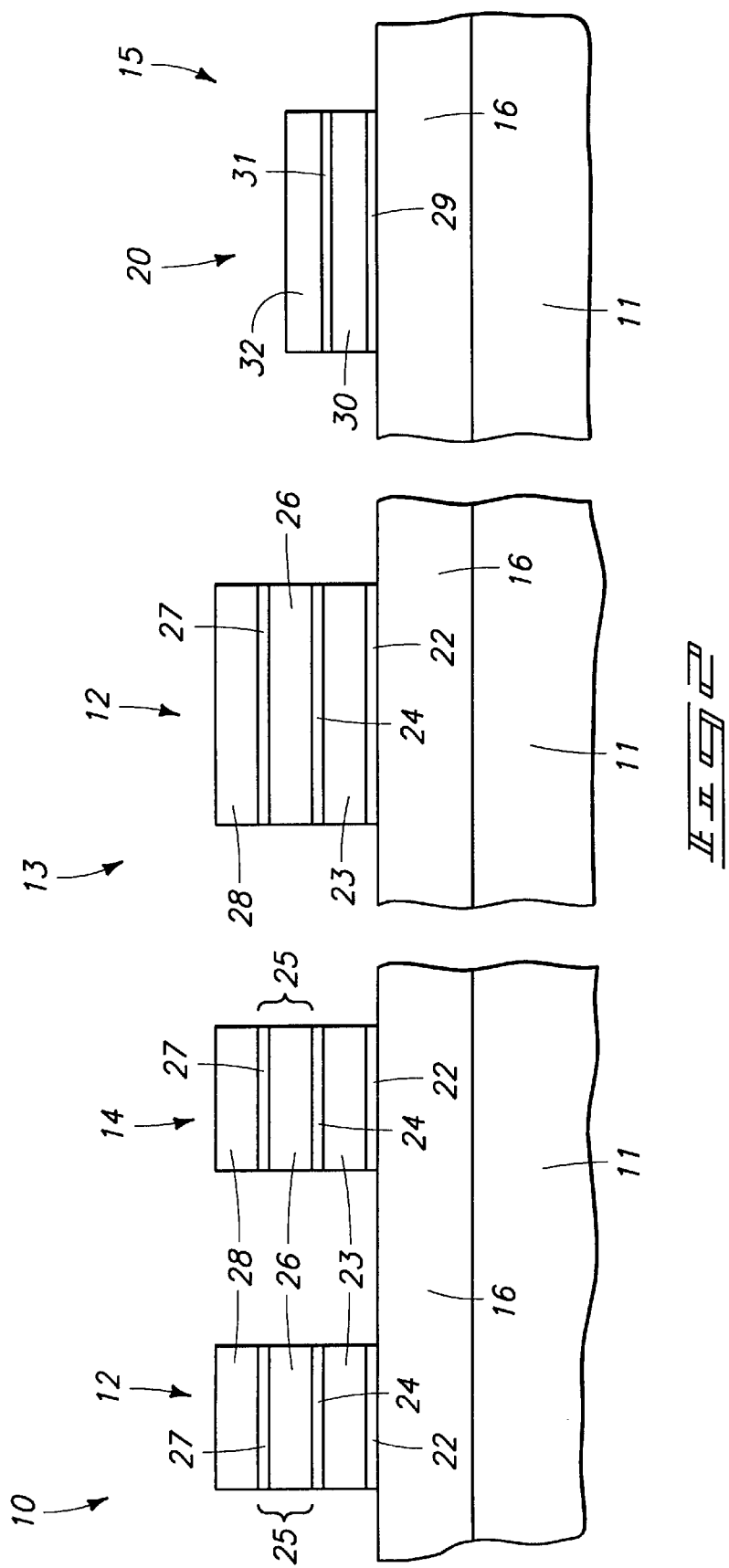
FIG. 2 is an expanded sectional view of the FIG. 1 wafer fragment which includes in its left-most portion a cut of the FIG. 1 wafer fragment taken through a line A—A in FIG. 1.

Referring to FIG. 2, three exemplary spaced portions of a semiconductor wafer and substrate are shown. Portion 10 comprises FLASH memory array area 10 of FIG. 1. A portion 13 comprises peripheral circuitry area to the memory array comprising an extension of line of floating gates 12. A portion 15 comprises some area, most preferably peripheral circuitry area, comprising a conductive line 20 which is different than lines of floating gates 12 and 14. Lines of floating gates 12 and 14 preferably constitute a gate dielectric layer 22, floating gate regions 23 (FIGS. 1 and 2), a gate dielectric layer 24, a conductive line extending portion 25 comprising a conductively doped polysilicon layer 26 and a conductive silicide layer 27, and an insulative cap 28. Therefore, caps 28 at least in part comprise provision of insulative material over lines of floating gates 12 and 14. Portion 13 of line 12 depicts an enlarged or widened portion of line of floating gates 12 typically provided to allow for photomask misalignment for making contact to line 12 in section/portion 13. Exemplary line 20 in portion 15 comprises a gate dielectric layer 29, a conductively doped polysilicon region 30, a conductive silicide region 31, and an insulating cap 32. Line 20 might comprise a transistor gate line as shown, an SRAM transistor gate line, a conductive interconnect line, or any other conductive line in the context of the invention. Drain and source implants in FLASH circuitry fabrication are typically separately conducted and optimized. Accordingly in a preferred implementation of this invention, drain implanting is next performed. A photoresist layer is ideally deposited and patterned (not shown) to mask the floating gate word lines and source areas therebetween, and to leave the drain areas and isolation regions therebetween outwardly exposed. Exemplary drain areas 36 (FIG. 1) are accordingly left outwardly exposed within active area regions 18. One or more suitable implants are then provided, typically n-type, to provide the desired depth and concentration of a conductivity enhancing impurity to form the desired transistor drains within active areas 18 at locations 36. Alternately, one or more blanket implants can be conducted without using a photoresist layer to fabricate the drains.

The source regions for the respective floating gate transistors are preferably next fabricated. Referring to FIGS. 3 and 4, a layer 40 preferably comprising photoresist is deposited and masked to cover the drain areas and substantial portions of the lines of floating gates, yet leave desired source regions exposed in lines running parallel and between the lines of floating gates on their desired source sides. Opening 42 constitutes one exemplary opening to floating gate source area of multiple transistors comprising lines of floating gates 12 and 14 along at least a portion thereof. Further in a common masking step with formation of opening 42, a discrete opening is formed over at least some of the lines of floating gates in the peripheral circuitry area and over at least one of the conductive line and the line of floating gates. FIG. 4 depicts two such openings 44 and 46 formed in addition to discrete opening 42 constituting a floating gate source area.

Figure 5:
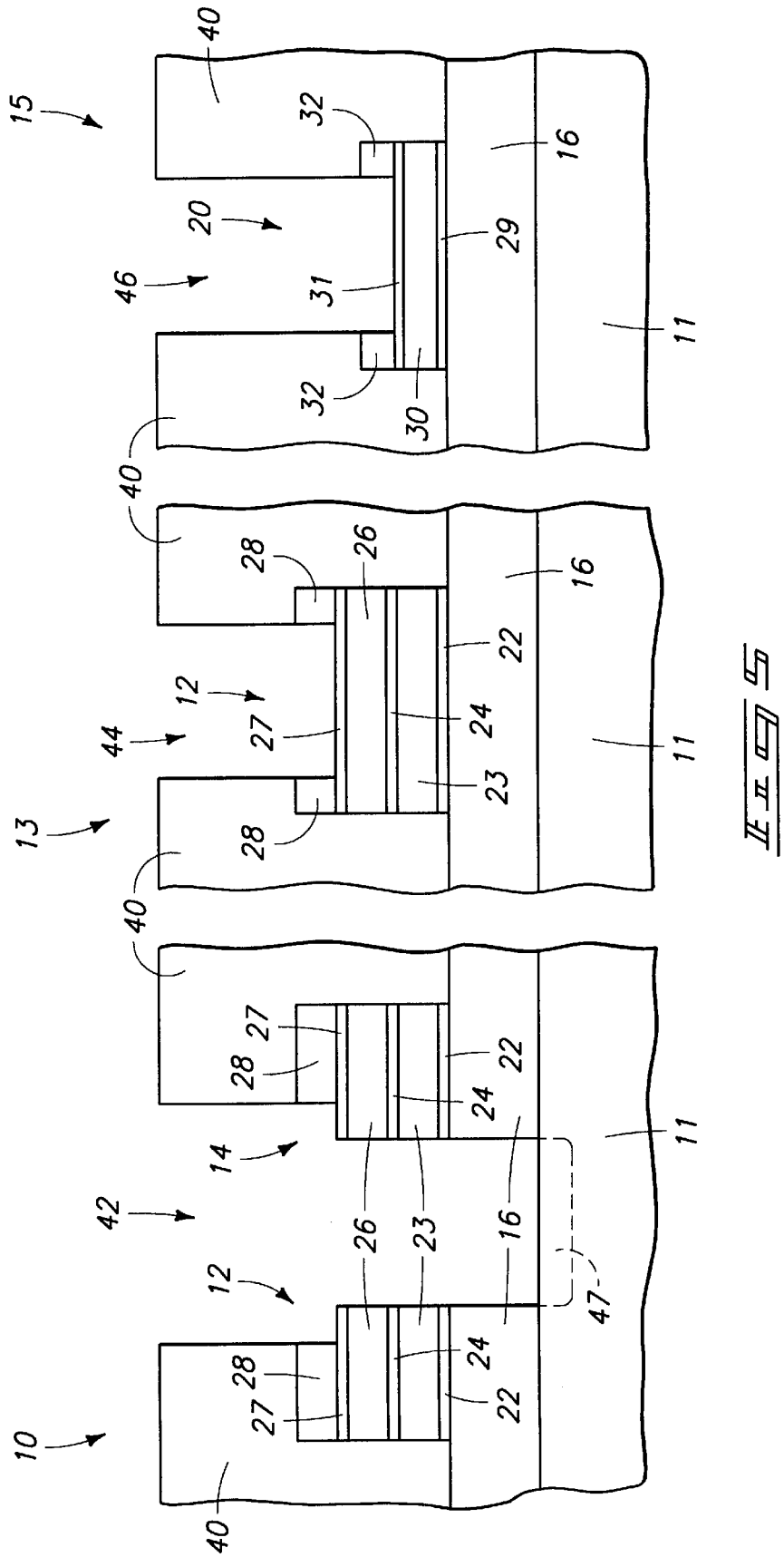
FIG. 5 is a view of the FIG. 4 wafer fragment at a processing step subsequent to that depicted by FIG. 4.
Figure 6:
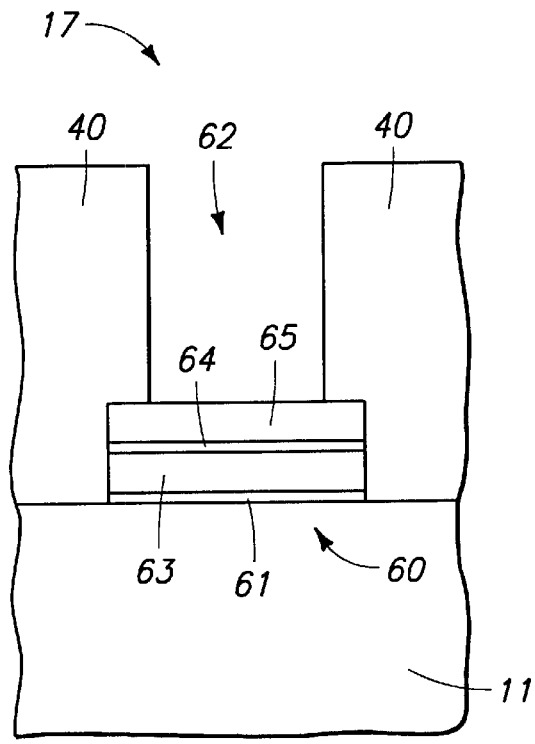

Referring to FIG. 5, etching is conducted to remove isolation material from exposed isolation regions 16 and exposed insulative material (such as material 28 and 32) from over lines of floating gates 12 and 14 and line 20 through discrete openings 42, 44 and 46. This extends such openings to expose semiconductive material of substrate 11 underlying isolation regions 16 and conductive material 27 of lines of floating gates 12 and 14, and conductive material 31 of line 20. Thus, isolation material 16 is etched from monocrystalline wafer 11 within floating gate source area defined by openings 42. Opening 44 is thereby formed to extend to conductive portions of lines of floating gates 12 and 14, and opening 46 is formed to extend to conductive portions of transistor gate line 20. Most preferably, the capping insulating material 28 of lines of floating gates 12 and 14, and that of layer 32 of gate line 20, comprises a common material, and the s same as isolation material 16, such that etching can be conducted simultaneously and with a single chemistry to remove the illustrated portions of such layers exposed through openings 42, 44 and 46. Alternately preferred, such materials are different but have substantially the same etch rate for a given chemistry and etching conditions. Ion implanting of a conductivity modifying impurity is then conducted into the exposed floating gate source area (i.e., into semiconductive material underlying the now removed isolation regions) to form source regions 47. Ion implanting will also thereby occur relative to openings 44 and 46 and into the upper conductive portions of the lines, with the previous conductivity enhancing impurity doping of the preferred polysilicon semiconductive material of lines 12, 14 and 20 preferably also comprising the same type. Example implantings include both phosphorus at a dose from 1–10 E14 ions/cm$^2$, energy at 30–100 keV, and arsenic at a dose from 0.5–5 E15 ions/cm$^2$, energy at 20–100 kev. Where layer 40 comprises photoresist and/or is sacrificial, it will ultimately be removed from the wafer, and ideally after conducting the ion implanting.

Typically and subsequently, an insulative spacer layer would be deposited and anisotropically etched to produce insulating spacers (not shown) about the drain and source sides of all gate lines. Further subsequent processing would typically deposit an insulating layer, such as borophosphosilicate glass (BPSG), to cover the previously exposed conductive material of lines 12, 14 and 20. Contact openings would subsequently be made through such layer to line 12 in area 13 and to line 20 in area 15. Prior art processing is understood to make contact openings to lines peripheral of the array separate from the masking to form the source implant in FLASH.

Further, and regardless of the masking, the invention contemplates in a common etching step, etching insulative material over a conductive line to expose conductive material of the line and insulative material over a semiconductor substrate in a line proximate a line of floating gates to expose the semiconductor substrate. The insulative material etched over the conductive line and the insulative material etched over the semiconductor substrate can comprise the same composition. By way of example only, material 16 and any of material 28 of lines 12, 14 and material 32 of line 20 preferably comprises undoped silicon dioxide.

Figure 6:
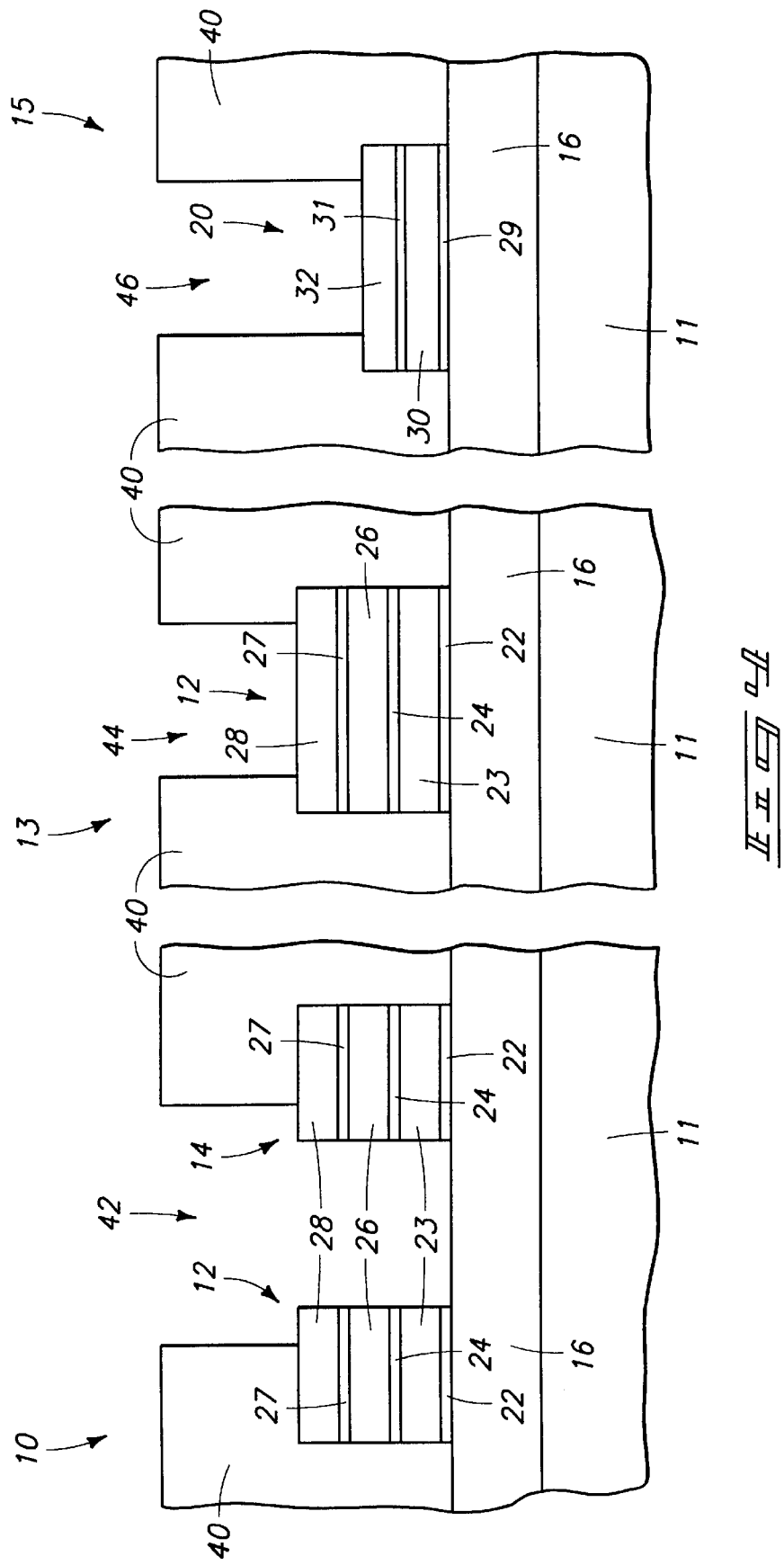
FIG. 6 is a view of additional or alternate processing occurring relative to an alternate portion of a semiconductor wafer fragment in conjunction with the FIGS. 1–5 processing.

Alternate or additional processing is initially next described with reference to FIGS. 6 and 7. The invention contemplates formation of FLASH memory and SRAM circuitry on the same wafer. FIG. 6 illustrates a portion 17 of a semiconductor wafer in process comprising an SRAM gate 60 formed over semiconductor substrate 11. SRAM gate 60 comprises a gate dielectric layer 61, conductively doped semiconductor material region 63, a conductive silicide region 64, and an insulative material cap 65. In a common masking step, an opening 62 is formed in layer 40 over SRAM gate 60 using the same mask which formed opening 42 defining floating gate source area of multiple transistors comprising lines of floating gates 12 and 14 along at least a portion thereof. Opening 62 can be and is preferably fabricated to include a contact opening to an SRAM gate line for formation of a local interconnect in an SRAM memory cell, such as an interconnecting line extending between a gate of one transistor and a source/drain region of another transistor within an SRAM cell.

Figure 7:
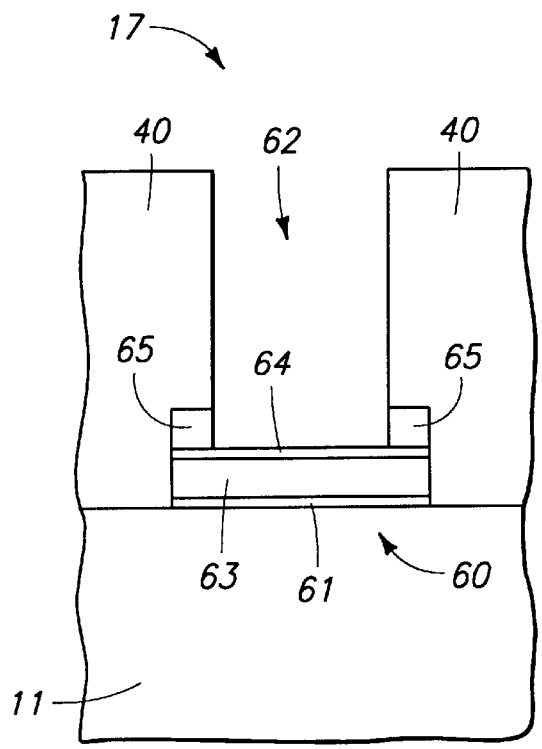
FIG. 7 is a view of the FIG. 6 wafer at a processing step subsequent to that shown by FIG. 6.

Referring to FIG. 7, and ideally commensurate with the processing depicted by FIG. 5, discrete opening 62 is extended by etching insulating material of layer 65 to expose conductive material 64 of SRAM gate 60. Ion implanting is then conductive of a conductivity modifying impurity to form source region 47 in FIG. 5. Such also effectively provides ion implanting into SRAM gate 60 through opening 62.

Figure 8:
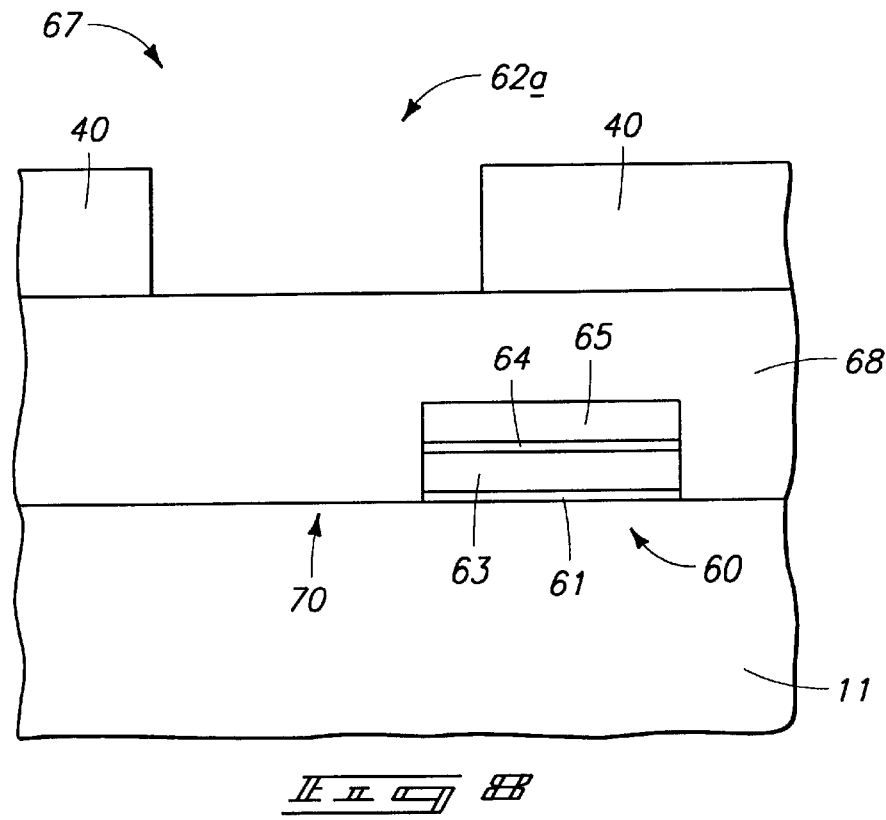
FIG. 8 is a view of additional or alternate processing occurring commensurate with processing depicted by any of FIGS. 1–7.
Figure 9:
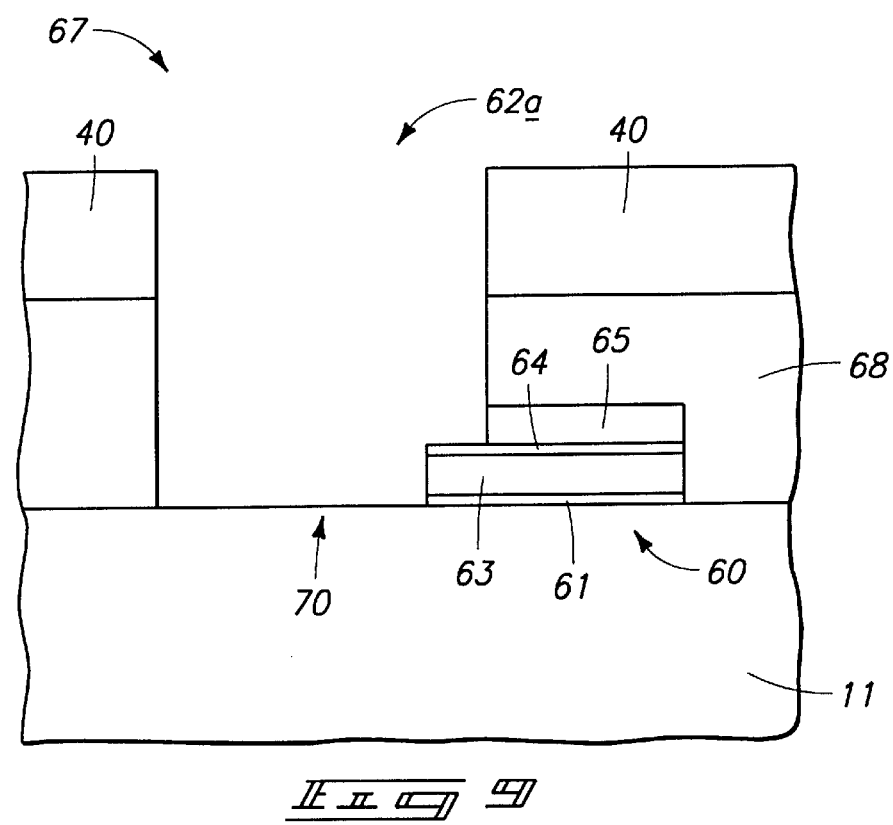
FIG. 9 is a view of the FIG. 8 wafer fragment at a processing step subsequent to that shown by FIG. 8.
Figure 10:
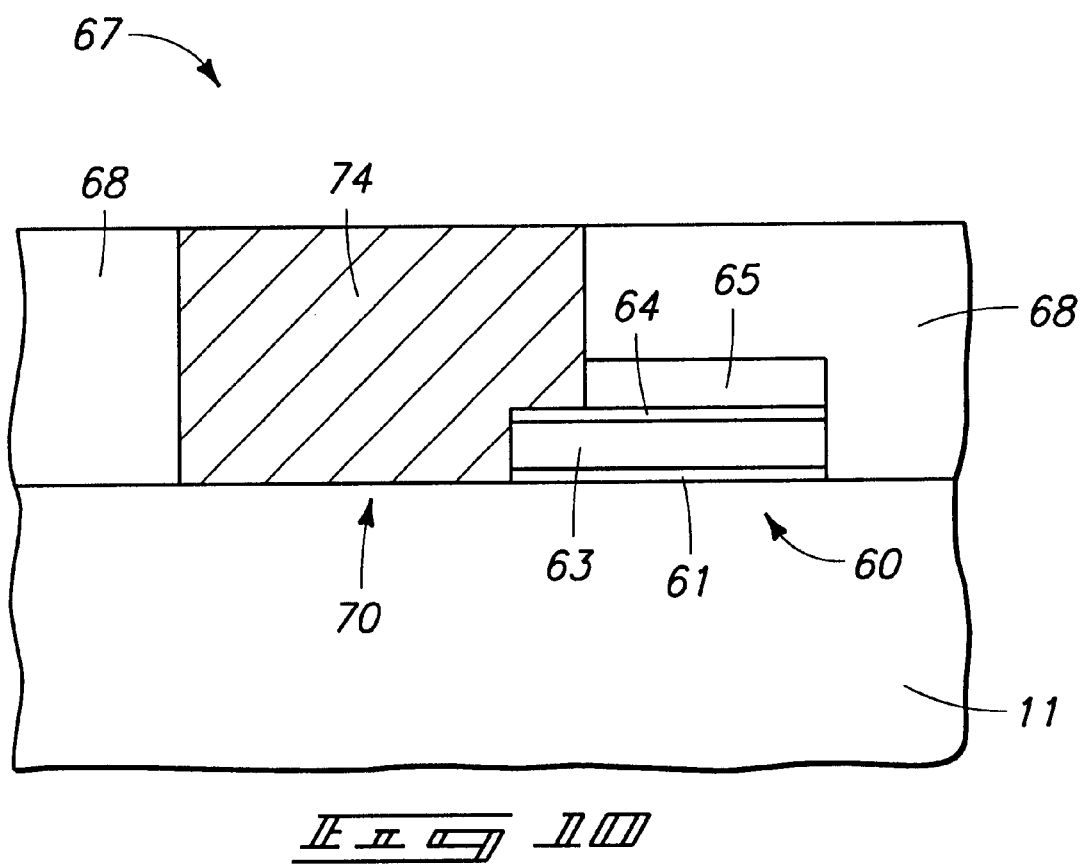
FIG. 10 is a view of the FIG. 8 wafer fragment at a processing step subsequent to that shown by FIG. 9.

FIGS. 8–10 illustrate additional or alternate processing whereby a local interconnect opening, in a common masking step with formation of opening 42, is formed over and extends from a gate to a source/drain area of the gate. Specifically, an SRAM gate 60 is shown formed over an SRAM cell area 67. A layer 68 of insulating material is deposited and ideally planarized over SRAM gate 60 and semiconductor substrate 11. A region 70 proximate SRAM gate 60 in this example constitutes a source/drain region of another SRAM gate of the SRAM memory cell. An opening 62a formed in layer 40 of photoresist comprises a local interconnect opening formed over and extending from SRAM gate 60 to source/drain area 70 formed in a common masking step with formation of an elongated source implant opening over floating gate source area, such as opening 42 in FIG. 3.

Referring to FIG. 9, opening 62a has been extended by etching through insulating material of layer 68 and SRAM gate cap 65 to expose conductive material of the SRAM gate and semiconductive material of source/drain area 70 of substrate 11. Ion implanting conducted in connection with source area formation through openings 42 in FIG. 4 would also typically be conducted through opening 62a in FIG. 9, thereby implanting into the SRAM gate and substrate material there-adjacent.

Referring to FIG. 10, subsequent processing can include deposition of an electrically conductive material over layer 68 and subsequent planarization thereof to form a conductive local interconnect 74 electrically connecting gate 60 and source/drain area 70. While described in this embodiment relative to an SRAM gate, other gate/substrate local interconnects could of course be utilized, such as a local interconnect relative to a logic gate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an array of FLASH memory comprising:
    forming a plurality of lines of floating gates extending from a memory array area to a peripheral circuitry area over a semiconductor substrate; and
    in a common masking step, forming discrete openings over a) at least some of the lines of floating gates in the peripheral circuitry area, and b) floating gate source area in multiple lines along at least portions of the lines of floating gates within the memory array area.

2. The method of claim 1 wherein the forming discrete openings comprises forming said openings within a layer of photoresist.

3. The method of claim 1 wherein the forming discrete openings comprises etching insulating material to expose conductive material of said at least some of the lines of floating gates.

4. The method of claim 1 wherein the forming discrete openings comprises etching insulating material to expose semiconductive material of the floating gate source area.

5. The method of claim 1 wherein the forming discrete openings comprises etching insulating material to expose conductive material of said at least some of the lines of floating gates and etching insulating material to expose semiconductive material of the floating gate source area.

6. The method of claim 1 further comprising conducting a common ion implant of conductivity modifying impurity into said at least some lines of floating gates and into the floating gate source area using the common masking step.

7. The method of claim 1 wherein the semiconductor substrate comprises a monocrystalline silicon wafer, and further comprising etching substrate isolation material from the monocrystalline wafer within the floating gate source area.

8. A method of forming FLASH memory comprising:
    forming a line of floating gates over a semiconductor substrate;
    forming a conductive line different from the line of floating gates over the semiconductor substrate; and
    in a common masking step, forming discrete openings to a) at least one of the conductive line and line of floating gates, and b) floating gate source area of multiple transistors comprising the line of floating gates along at least a portion of the line of floating gates, the opening to the floating gate source area being an elongated line running continuously along at least a portion of the line of floating gates.

9. A method of forming FLASH memory comprising:
    forming a line of floating gates over a semiconductor substrate;
    forming a conductive line different from the line of floating gates over the semiconductor substrate;
    in a common masking step, forming discrete openings to a) at least one of the conductive line and line of floating gates, and b) floating gate source area of multiple transistors comprising the line of floating gates along at least a portion of the line of floating gates; and
    further comprising conducting a common ion implant of conductivity modifying impurity into said at least one line and into the floating gate source area using the common masking step.

10. The method of claim 8 wherein at least one of said discrete openings is formed to the conductive line.

11. The method of claim 8 wherein at least one of said discrete openings is formed to the line of floating gates.

12. The method of claim 8 wherein the semiconductor substrate comprises a monocrystalline silicon wafer, and further comprising etching substrate isolation material from the monocrystalline wafer within the floating gate source area.

13. The method of claim 8 wherein in the common masking step, forming discrete openings to both the conductive line and the line of floating gates.

14. A method of forming FLASH memory and SRAM circuitry comprising:
    forming a line of floating gates over a semiconductor substrate;
    forming an SRAM gate over the semiconductor substrate; and
    in a common masking step, forming discrete openings over a) the SRAM gate, and b) floating gate source area of multiple transistors comprising the line of floating gates along at least a portion of the line of floating gates.

15. The method of claim 14 wherein the forming discrete openings comprises etching insulating material to expose conductive material of the SRAM gate.

16. The method of claim 14 wherein the forming discrete openings comprises etching insulating material to expose semiconductive material of the floating gate source area.

17. The method of claim 14 wherein the forming discrete openings comprises etching insulating material to expose conductive material of the SRAM gate and etching insulating material to expose semiconductive material of the floating gate source area.

18. The method of claim 14 further comprising conducting a common ion implant of conductivity modifying impurity into the SRAM gate and into the floating gate source area using the common masking step.

19. The method of claim 14 wherein the semiconductor substrate comprises a monocrystalline silicon wafer, and further comprising etching substrate isolation material from the monocrystalline wafer within the floating gate source area.

20. A method of forming FLASH memory and SRAM circuitry comprising:
    forming a line of floating gates over a semiconductor substrate;
    forming an SRAM gate over the semiconductor substrate and in an SRAM cell area; and in a common masking step, forming a local interconnect opening over and extending from the SRAM gate to a source/drain area in the SRAM cell area and an elongated source implant opening over floating gate source area of multiple transistors comprising the line of floating gates along at least a portion of the line of floating gates.

21. The method of claim 20 wherein the forming a local interconnect opening comprises etching insulating material to expose conductive material of the SRAM gate.

22. The method of claim 20 wherein the forming a local interconnect opening comprises etching insulating material to expose semiconductive material of the source/drain area in the SRAM cell.

23. The method of claim 20 wherein the forming an elongated source implant opening comprises etching insulating material to expose semiconductive material of the floating gate source area.

24. The method of claim 20 wherein the forming a local interconnect opening comprises etching insulating material to expose conductive material of the SRAM gate and etching insulating material to expose semiconductive material of the source/drain area in the SRAM cell.

25. The method of claim 20 wherein the forming a local interconnect opening comprises etching insulating material to expose conductive material of the SRAM gate and the forming an elongated source implant opening comprises etching insulating material to expose semiconductive material of the floating gate source area.

26. The method of claim 20 wherein the forming a local interconnect opening comprises etching insulating material to expose semiconductive material of the source/drain area in the SRAM cell and the forming an elongated source implant opening comprises etching insulating material to expose semiconductive material of the floating gate source area.

27. The method of claim 20 wherein the forming a local interconnect opening comprises etching insulating material to expose conductive material of the SRAM gate and etching insulating material to expose semiconductive material of the source/drain area in the SRAM cell, and the forming an elongated source implant opening comprises etching insulating material to expose semiconductive material of the floating gate source area.

28. The method of claim 20 further comprising conducting a common ion implant of conductivity modifying impurity into the SRAM gate and into the floating gate source area using the common masking step.

29. The method of claim 20 wherein the semiconductor substrate comprises a monocrystalline silicon wafer, and further comprising etching substrate isolation material from the monocrystalline wafer within the floating gate source area.

30. In a common etching step, etching insulative material over a conductive line to expose conductive material of the line and insulative material over a semiconductor substrate in a line proximate and running continuously along at least a portion of a line of floating gates to expose the semiconductor substrate.

31. The etching of claim 30 wherein the insulative material etched over the conductive line and the insulative material etched over the semiconductor substrate comprise the same composition.

32. The etching of claim 30 wherein the insulative material etched over the conductive line and the insulative material etched over the semiconductor substrate comprise different compositions.

33. The etching of claim 30 wherein the insulative material etched over the conductive line and the insulative material etched over the semiconductor substrate comprise different compositions having substantially the same etching rates for a given etching chemistry and etching conditions.

34. The etching of claim 30 wherein the insulative material etched over the conductive line and the insulative material etched over the semiconductor substrate comprise undoped silicon dioxide.

35. The etching of claim 30 wherein the insulative material etched over the conductive line and the insulative material etched over the semiconductor substrate consists essentially of undoped silicon dioxide.

36. In a common etching step, etching insulative material over an SRAM gate to expose conductive material of the SRAM gate and insulative material over a semiconductor substrate in a line proximate and running continuously along at least a portion of a line of floating gates to expose the semiconductor substrate.

37. The etching of claim 36 wherein the insulative material etched over the conductive line and the insulative material etched over the semiconductor substrate comprise the same composition.

38. The etching of claim 36 wherein the insulative material etched over the conductive line and the insulative material etched over the semiconductor substrate comprise different compositions.

39. The etching of claim 36 wherein the insulative material etched over the conductive line and the insulative material etched over the semiconductor substrate comprise different compositions having substantially the same etching rates for a given etching chemistry and etching conditions.

40. The etching of claim 36 wherein the insulative material etched over the conductive line and the insulative material etched over the semiconductor substrate comprise undoped silicon dioxide.

41. The etching of claim 36 wherein the insulative material etched over the conductive line and the insulative material etched over the semiconductor substrate consists essentially of undoped silicon dioxide.

42. In a common etching step, etching insulative material over an SRAM cell source area to expose semiconductive material of the SRAM cell source area and insulative material over a semiconductor substrate in a line proximate and running continuously along at least a portion of a line of floating gates to expose the semiconductor substrate.

43. The etching of claim 42 wherein the insulative material etched over the conductive line and the insulative material etched over the semiconductor substrate comprise the same composition.

44. The etching of claim 42 wherein the insulative material etched over the conductive line and the insulative material etched over the semiconductor substrate comprise different compositions.

45. The etching of claim 42 wherein the insulative material etched over the conductive line and the insulative material etched over the semiconductor substrate comprise different compositions having substantially the same etching rates for a given etching chemistry and etching conditions.

46. The etching of claim 42 wherein the insulative material etched over the conductive line and the insulative material etched over the semiconductor substrate comprise undoped silicon dioxide.

47. The etching of claim 42 wherein the insulative material etched over the conductive line and the insulative material etched over the semiconductor substrate consists essentially of undoped silicon dioxide.

48. In a common etching step, etching insulative material over a transistor gate and semiconductor substrate adjacent the gate to form at least one continuous local interconnect contact between the semiconductor substrate and gate, and insulative material over semiconductor substrate material in a line proximate and running continuously along at least a portion of a line of floating gates to expose the semiconductor substrate material.

49. In a common etching step, etching insulative material over a first gate line to expose the first gate line, and insulative material over a second gate line and semiconductor substrate material adjacent the second gate line to form at least one continuous local interconnect contact between the semiconductor substrate and the second gate line.

50. The etching of claim 49 wherein the first gate line is a line of floating gates.

51. A method of forming an array of FLASH memory comprising:
   forming a plurality of lines of floating gates extending from a memory array area to a peripheral circuitry area over a semiconductor substrate;
   providing an alternating series of isolation regions and active area regions in the semiconductor substrate in lines adjacent and along at least portions of the lines of floating gates;
   providing insulative material over the lines of floating gates;
   in a common masking step, forming discrete openings in a layer overlying the insulative material over a) at least some of the lines of floating gates in the peripheral circuitry area, and b) the isolation regions and active area regions in multiple lines along said portions of the lines of floating gates within the memory array area;
   etching the isolation material from the isolation regions and insulative material from over the line of floating gates through the discrete openings effective to extend the discrete openings to expose semiconductive material underlying the isolation regions and conductive material of the line of floating gates; and
   in a common step, ion implanting a conductivity modifying impurity through the discrete openings and into the semiconductive material underlying the isolation regions and the conductive material of the floating gate.

52. The method of claim 51 further comprising removing the layer.

53. The method of claim 51 further comprising removing the layer before conducting the ion implanting.

54. The method of claim 51 further comprising removing the layer after conducting the ion implanting.

55. A method of forming SRAM and an array of FLASH memory comprising:
   forming a plurality of lines of floating gates extending from a memory array area to a peripheral circuitry area over a semiconductor substrate;
   providing an alternating series of isolation regions and active area regions in the semiconductor substrate in lines adjacent and along at least portions of the lines of floating gates;
   providing insulative material over the line of floating gates;
   forming an SRAM gate over the semiconductor substrate;
   providing insulative material over the SRAM gate;
   in a common masking step, forming discrete openings in a layer overlying the insulative material of the SRAM gate and the insulative material overlying the lines of floating gates, the discrete openings being formed over a) the SRAM gate, and b) the active area regions and isolation regions in multiple lines along said portions of the lines of floating gates within the memory array area;
   etching insulative material from over the SRAM gate and isolation material from the isolation regions through the discrete openings effective to extend the discrete openings to expose semiconductive material underlying the isolation regions and conductive material of the SRAM gate; and
   in a common step, ion implanting a conductivity modifying impurity through the discrete openings and into the semiconductive material underlying the isolation regions and the conductive material of the SRAM gate.

56. The method of claim 55 further comprising removing the layer.

57. The method of claim 55 further comprising removing the layer before conducting the ion implanting.

58. The method of claim 55 further comprising removing the layer after conducting the ion implanting.

59. The method of claim 55 further comprising, in the common masking step, forming a discrete opening over at least some of the lines of floating gates in the peripheral circuitry area, and wherein the etching comprises etching insulative material from over the line of floating gates effective to extend the discrete opening over the floating gate to expose conductive material of the floating gate, and wherein the ion implanting is conducted into the floating gate.

60. The method of claim 9 wherein the opening to the floating gate source area is an elongated line running along at least a portion of the line of floating gates.

* * * * *

UNITED STATES PATENT AND TRADEMARK OFFICE
CERTIFICATE OF CORRECTION

PATENT NO.    : 6,406,959 B2
DATED         : June 18, 2002
INVENTOR(S)   : Kirk D. Prall et al.

It is certified that error appears in the above-identified patent and that said Letters Patent is hereby corrected as shown below:

<u>Column 5,</u>
Line 41, replace "common material, and the s same as isolation" with
-- common material, and the same as isolation --

Signed and Sealed this

Eleventh Day of February, 2003

JAMES E. ROGAN
*Director of the United States Patent and Trademark Office*